US010663281B2

(12) United States Patent
Manassen et al.

(10) Patent No.: US 10,663,281 B2
(45) Date of Patent: May 26, 2020

(54) SYSTEMS AND METHODS FOR OPTIMIZING FOCUS FOR IMAGING-BASED OVERLAY METROLOGY

(71) Applicant: KLA-Tencor Corporation, Milpitas, CA (US)

(72) Inventors: Amnon Manassen, Haifa (IL); Andrew Hill, Berkeley, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 59 days.

(21) Appl. No.: 15/574,294

(22) PCT Filed: Sep. 14, 2017

(86) PCT No.: PCT/US2017/051651
§ 371 (c)(1),
(2) Date: Nov. 15, 2017

(87) PCT Pub. No.: WO2018/053192
PCT Pub. Date: Mar. 22, 2018

(65) Prior Publication Data
US 2018/0292198 A1 Oct. 11, 2018

Related U.S. Application Data

(60) Provisional application No. 62/394,838, filed on Sep. 15, 2016.

(51) Int. Cl.
*G01B 11/02* (2006.01)
*G01B 9/02* (2006.01)
(Continued)

(52) U.S. Cl.
CPC ..... *G01B 9/02035* (2013.01); *G01B 9/02042* (2013.01); *G01B 9/02091* (2013.01);
(Continued)

(58) Field of Classification Search
CPC ........... G01B 9/02035; G01B 9/02036; G01B 9/02042; G01B 9/02063; G01B 9/02091;
(Continued)

(56) References Cited

U.S. PATENT DOCUMENTS 5,486,701 A   1/1996 Norton et al.
7,012,700 B2  3/2006 De Groot et al.
(Continued)

FOREIGN PATENT DOCUMENTS

WO   2015031589 A1   3/2015

OTHER PUBLICATIONS

ISA/KR, International Search Report for PCT/US2017/051651 dated Jan. 25, 2018.

*Primary Examiner* — Tarifur R Chowdhury
*Assistant Examiner* — Jonathon Cook
(74) *Attorney, Agent, or Firm* — Hodgson Russ LLP (57) ABSTRACT

Methods and systems for focusing and measuring by mean of an interferometer device, having an optical coherence tomography (OCT) focusing system, by separately directing an overlapped measurement and reference wavefront towards a focus sensor and towards an imaging sensor; where a predefined focusing illumination spectrum of the overlapped wavefront is directed towards the focus sensor, and where a predefined measurement illumination spectrum of the overlapped wavefront is directed towards the imaging sensor. Methods and systems for maintaining focus of an interferometer device, having an OCT focusing system, during sample's stage moves.

16 Claims, 10 Drawing Sheets

(51) Int. Cl.
*G03F 7/20* (2006.01)
*G01B 11/27* (2006.01)

(52) U.S. Cl.
CPC ........ *G01B 11/272* (2013.01); *G03F 7/70633* (2013.01); *G01B 2210/56* (2013.01)

(58) Field of Classification Search
CPC .............. G01B 11/272; G01B 2210/56; G03F 7/70633
USPC .................................................. 356/479, 497
See application file for complete search history.

(56) References Cited

U.S. PATENT DOCUMENTS

| | | |
|---|---|---|
| 7,034,271 B1 | 4/2006 | Sinclair et al. |
| 7,193,715 B2 | 3/2007 | Smedt et al. |
| 8,508,748 B1 | 8/2013 | Manassen |
| 9,104,120 B2 | 8/2015 | Seligson |
| 2005/0128476 A1 | 6/2005 | Zhao |
| 2008/0186549 A1* | 8/2008 | Neijzen ............... G03F 7/70383 359/196.1 |
| 2009/0153839 A1 | 6/2009 | Kay |
| 2010/0128283 A1 | 5/2010 | Liesener et al. |
| 2012/0033215 A1 | 2/2012 | Kandel et al. |
| 2012/0033226 A1 | 2/2012 | Manassen et al. |
| 2012/0057446 A1* | 3/2012 | Patland .............. G01R 33/0325 369/53.38 |
| 2014/0293407 A1* | 10/2014 | Amano .............. G02B 21/0044 359/368 |
| 2015/0173846 A1* | 6/2015 | Schneider .......... A61B 1/00009 600/424 |

* cited by examiner

SYSTEMS AND METHODS FOR OPTIMIZING FOCUS FOR IMAGING-BASED OVERLAY METROLOGY

CROSS REFERENCE TO RELATED APPLICATIONS

This application claims the benefit of U.S. Provisional Patent Application No. 62/394,838 filed on Sep. 15, 2016, which is incorporated herein by reference in its entirety.

TECHNICAL FIELD

The present invention relates to the field of metrology, and more particularly, to optimizing focus and measuring for imaging-based overlay metrology.

BACKGROUND OF THE INVENTION

Optical coherence tomography (OCT) is an optical signal acquisition and processing method. It captures micrometer-resolution three-dimensional images from within optical scattering media. OCT relays on interferometric technique, typically by employing near-infrared light. The use of such relatively long wavelength light allows the light to penetrate into a scattering medium. Depending on the properties of the light source (e.g. where super-luminescent diodes and ultra-short pulsed lasers have been employed), OCT has achieved sub-micrometer resolution (with very wide-spectrum sources emitting over about 100 nm wavelength range).

OCT is one of a class of optical tomographic techniques. A relatively recent implementation of OCT is frequency-domain optical coherence tomography, which provides advantages in signal-to-noise ratio and permits faster signal acquisition. OCT is often used as an optical method in biology and medicine. Commercially available OCT systems are employed in diverse applications, including art conservation, and diagnostic medicine, notably in ophthalmology where it can be used to obtain detailed images from within the retina.

Generally in inspection tasks and particularly in optical metrology there is an ever-increasing importance to the accurate determination of the sensing head distance from the inspected target. This is because of the frequent connection between the system-target distance and the overall measurement accuracy. As OCT operates essentially in the same way as a Linnik interferometer, OCT can be considered for use as a focus sensor like the Linnik interferometer. A Linnik interferometer (as known in the art) is a two-beam interferometer usually used in microscopy, surface contour measurements, topography and optical overlay metrology.

In overlay scatterometry (be it pupil scatterometry or field scatterometry) the overlay mark is commonly a grating-over-grating structure and the overlay information is carried in the relative phase of the lower and upper gratings. In overlay scatterometry of a side-by-side type, the overlay mark (i.e., the metrology target) may comprise a grating next to a grating structure and the overlay information may also be carried in the relative phase of the lower and upper gratings.

In overlay imaging the overlay mark (i.e., the metrology target) can consist separate marks for separate layers and the overlay information is carried in the position of each individual mark on the detector which, in turns, is a result of interferences between different diffraction orders of the individual marks.

Figure 1:
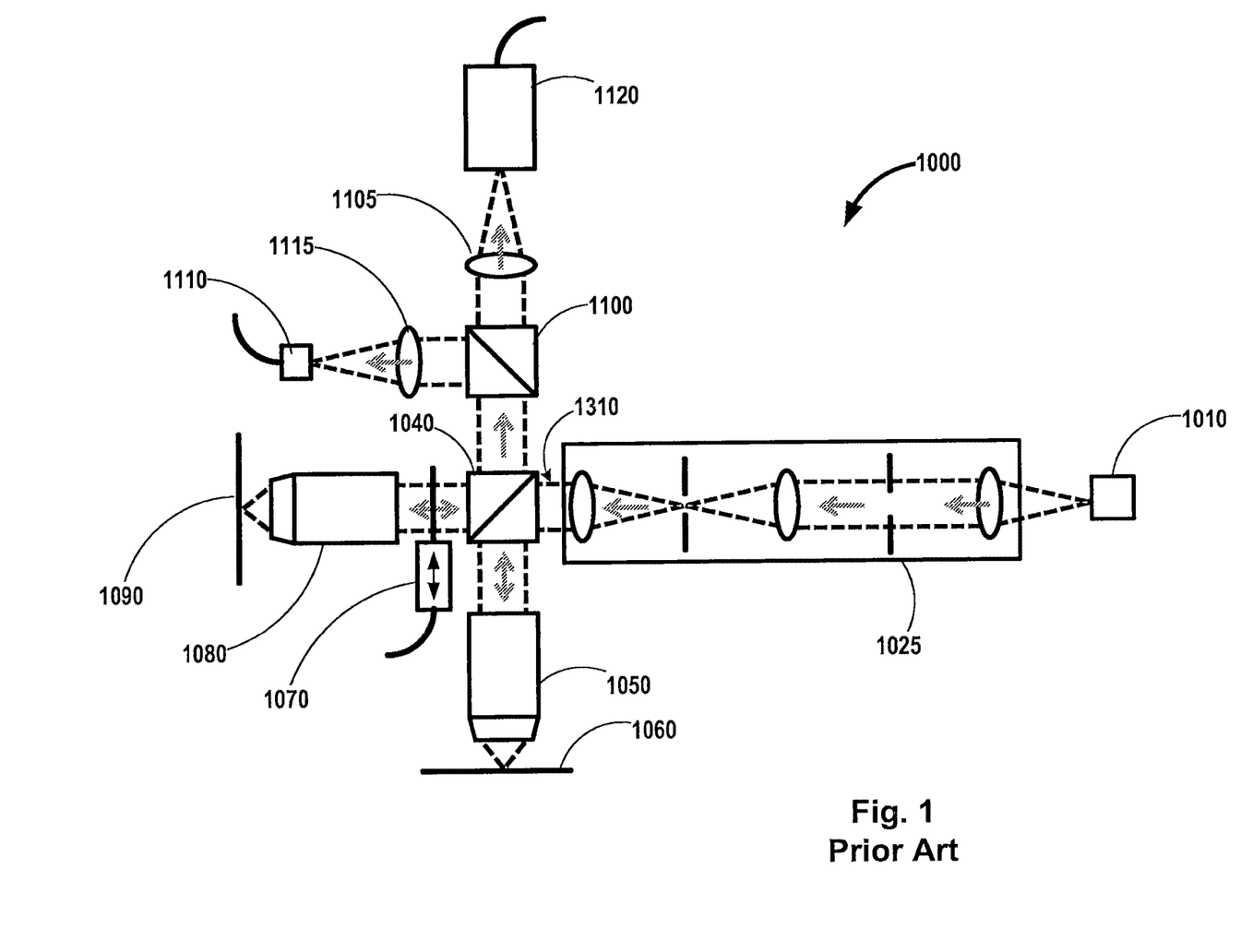
FIG. 1 schematically demonstrates a prior art image-based overlay measurement tool, with Linnik focus detection.
Figures 2A, 2B:
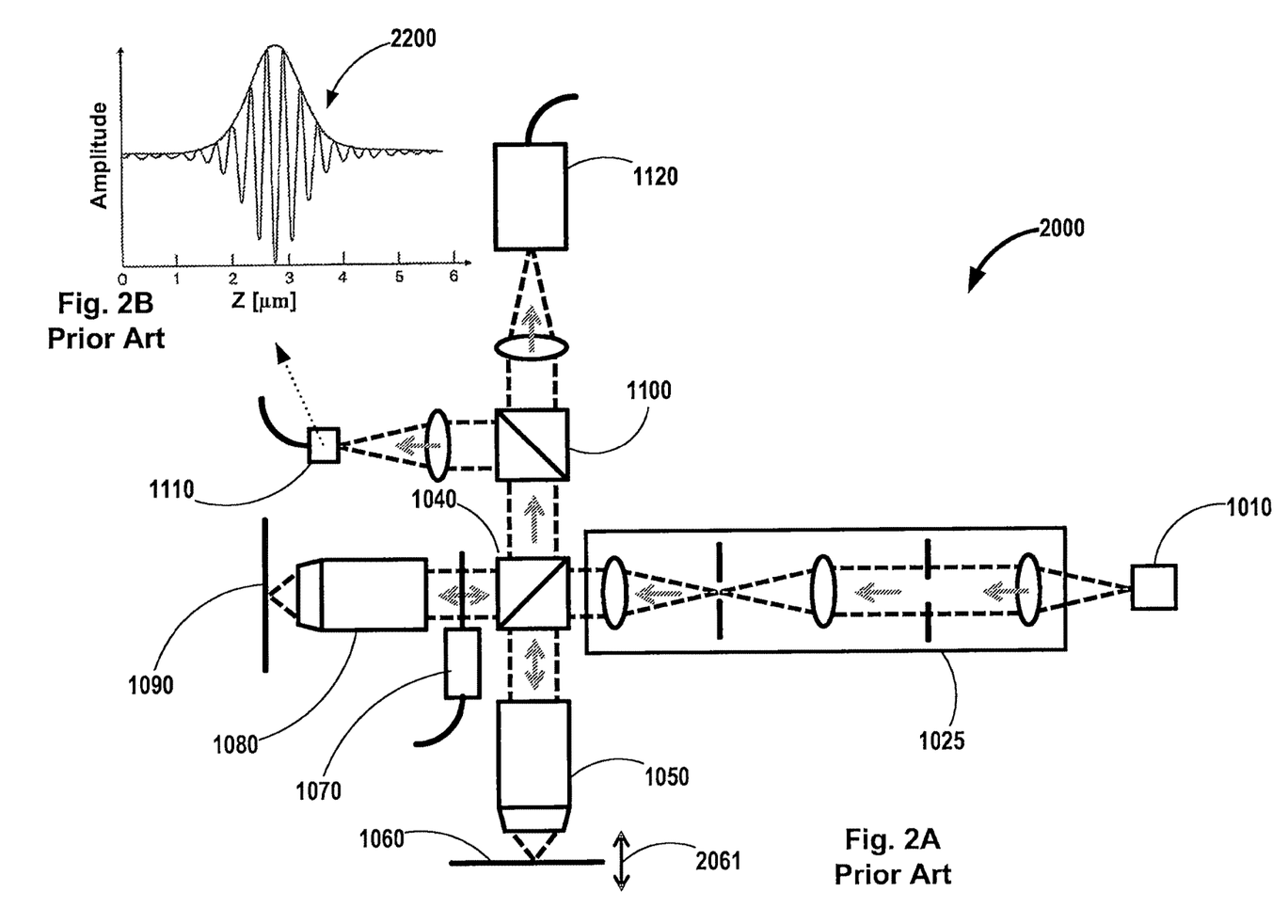
FIG. 2A schematically demonstrates another prior art image-based overlay measurement tool, similar to FIG. 1.
FIG. 2B schematically demonstrates a prior art output signal of the focus detector (FD), demonstrated in FIG. 2A.

Reference is now made to FIGS. 1, 2A and 2B, which schematically demonstrate examples for of a conventional metrology tool 1000 using a Linnik interferometer, as known in the art, which can be used to perform imaging overlay measurements on target structures at the surface of a sample 1060 (e.g. overlay targets at a wafer's surface). The metrology tool 1000, as sown in FIG. 1, can include a light source 1010 optically coupled to illumination optics 1025, potentially with angular and/or spatial dynamic control, for generating a probe beam of radiation 1310. The probe beam 1310 may be turned towards the sample 1060 with a 50/50 beam splitter 1040 (e.g. a Linnik beam splitter). The probe beam 1310 may be focused onto the surface of the sample 1060 with measurement optics 1050 (also noted as measurement objective lens).

Probe beam radiation scattered from the target is collected and collimated by the measurement objective lens 1050 and at least a fraction of the sample beam passes through the beam splitter 1040 and up an optical column of the tool. The fraction of the sample beam may be passed through tube lens/es 1105 and focused on an image detector 1120, such as a Charge-Coupled Device (CCD).

The demonstrated metrology tool 1000 further includes an OCT focusing system having a second beam splitter 1100 (also noted as focus beam splitter), optionally a focus detector lens 1115, a focus detector (FD) 1110 (also noted as focus sensor), reference optics 1080 (also noted as reference objective lens), and a reflector 1090 (e.g. reference mirror surface) that are all arranged in a Linnik-type interferometer configuration. In a Linnik-type interferometer, the reference objective 1080 and the measurement objective 1050 have similar optical performances and complementary optical properties, so that the optical path length of the sample and the reference arms match.

FIGS. 1 and 2A further demonstrate a mechanical shutter 1070, which selectively opens and closes an optical path between the beam splitter 1040 and the reference objective 1080, which focuses a reference beam onto the reflector 1090. The reference beam passes back through the reference objective 1080 toward the beam splitter 1040.

Another fraction of the probe beam power (referred to as the sample beam) is reflected from the sample 1060, and is directed toward the beam splitter 1040, after which it travels together with the reference beam. The two beams are then directed to the focus beam splitter 1100, which directs them both onto the focus detector 1110 where they interfere. Interference fringes are detected at the focus detector 1110 as a result of interference between the sample beam and the reference beam. The interference fringes can be analyzed in order to detect whether the probe beam is in focus at the sample 1060.

The metrology tool as demonstrated in FIG. 2A, demonstrates a device 2000 similar to the device demonstrated in FIG. 1. The metrology tool 2000 may further include a stage (not shown) configured to hold the sample 1060 and a translation mechanism (not shown) may be mechanically coupled to the stage, where the translation mechanism is configured to move the stage in a direction 2061 parallel to the optical axis of the measurement objective lens. FIG. 2B schematically demonstrates an FD's 1110 optional output signal 2200, which can be analyzed in order to detect whether the probe beam is in focus at the sample 1060.

For example, light from sample and reference paths interferes, when lengths of two paths differ by less than coherence length of illumination, accordingly, optimal sample position can be defined as the position where interference contrast is maximal, or at some offset from the position where contrast is maximal.

The common practice for an OCT system can be generally noted as: move, focus, and measure. Usually, the reference mirror 1090 is positioned in a one-time calibration so that maximum interference contrast coincides with maximum contrast of target's image on the imaging sensor 1120; and the following steps are:

Move: at initial step, the sample's stage (not shown) is moved to bring a target structure at the sample's surface into the imaging sensor's field of view.

Focus: at the next step, separation (i.e. distance) between measurement objective 1050 and sample 1060 is scanned in order to modulate fringes formed at focus sensor 1110, as shown in FIG. 2B. Analysis of the FD's output signal 2200 allows the identifying of the separation between measurement objective lens 1050 and the sample 1060, which yields maximum fringe contrast. Accordingly, the separation between the main objective 1050 and the sample 1060 is set to provide a maximal fringe contrast.

Measure: at this step, the sample is imaged by the imaging sensor 1120, where the shutter 1070 of the reference path is closed during acquisition, for the target's overlay measurement.

At the following, the stage is moved to set the measurement illumination onto the next target structure on the sample's surface, which is to be imaged.

However, the implemented OCT focus system, as discussed above and as illustrated in FIGS. 1 and 2A, has some disadvantages. Until now, no attempt was made to maintain focus during stage moves to each target at the sample's surface. After each stage move, the distance between the measurement objective lens 1050 and the sample 1060 should be scanned to identify position for maximal fringe contrast; sample to objective separation should then be set to such optimal position, after every stage move. Such focusing, after each stage move, increases the time required for each target measurement.

Furthermore, the illumination spectrum is defined once for each target and is the same both for the focusing and the measuring tasks, while the optimal spectrum for the focusing task might be different than the optimal spectrum for overlay sample measurement.

Focusing signals and sample images change with wavelength, for example: a reflectance of different materials on the sample (e.g. an overlay wafer) vary with wavelength; penetration of light to different layers on the sample varies with wavelength; and scatter and diffraction of light from features on the sample vary with wavelength. Focus signals and sample images may change with sample processing variations (e.g. film thickness, resist exposure, etch'depth, and more). The wavelength used for focusing that provides the greatest insensitivity to process and target site variations, may not be the same wavelength that provides the most robust overlay measurements. Accordingly, when a common illumination spectrum is used both for focusing and for measurement tasks, some performance is lost due to the compromised spectrum selection.

Furthermore, because the focusing system uses the same illumination as is used for metrology, the spectrum available for focusing is constrained to the bandwidth used for metrology and does not enable the use of the widest possible spectral bandwidth for focusing. This is disadvantageous because a short coherence length is desired for the OCT-based focusing system and coherence length is inversely related to the bandwidth of the illumination used.

It is within this context that embodiments of the present invention arise.

SUMMARY OF THE INVENTION

Some embodiments provide a metrology and inspection system, comprising:
an optical metrology tool having an optical column with a first beam splitter optically coupled to a first objective; and
an optical coherence tomography focusing system comprising:
a second objective and a reference surface arranged in an interferometer configuration with the first beam splitter, and
a second beam splitter optically coupled to an output wavefront of the first beam splitter;
wherein:
the reference surface is a dichroic reflector, configured to reflect illumination within a predetermined focusing spectrum; and/or
the second beam splitter is a dichroic beam splitter, configured to direct illumination within a predetermined focusing spectrum to a focus sensor and to direct illumination within a predetermined measurement spectrum to an imaging sensor.

In some embodiments, the metrology and inspection system further comprising illumination optics optically coupled to the first beam splitter.

In some embodiments, the metrology and inspection further comprising an illumination input optically coupled to the illumination optics.

In some embodiments, the illumination input comprises a fiber optic coupler, configured to carry both the focusing and the measurement illumination spectrums.

In some embodiments, the illumination optics comprises: at least one optical lens, an illumination pupil aperture and an illumination field stop.

In some embodiments, the metrology and inspection system further comprising a mechanical shutter, configured to selectively open and close the optical path between the first beam splitter and the second objective.

In some embodiments, the metrology and inspection system further comprising at least one of: focus detector lens and at least one tube lens.

In some embodiments, the predetermined focusing spectrum is about 380-430 nm and the predetermined measuring spectrum is about 430-1200 nm.

Some embodiments of the present invention provide a metrology and inspection system, comprising:
an optical metrology tool having an optical column with a first beam splitter optically coupled to a first objective; and
an optical coherence tomography (OCT) focusing system comprising:
a second objective and a reference surface arranged in an interferometer configuration with the first beam splitter, and
a second beam splitter optically coupled to the output wavefront of the first beam splitter;
wherein:
the reference surface is a dichroic reflector, configured to reflect illumination within a focusing spectrum; and/or the focusing system further comprising:
  a focus spectral filter wheel, optically coupled between second beam splitter and a focus sensor, configured to direct illumination within the focusing spectrum to the focus sensor; and
  an imaging spectral filter wheel, optically coupled between the second beam splitter and an imaging sensor, configured to direct illumination within a measurement spectrum to the imaging sensor.

In some embodiments, the predetermined focusing spectrum is about 380-430 nm and the predetermined measuring spectrum is about 430-1200 nm.

Some embodiments of the present invention provide a method for focusing and measuring using an interferometer device having an optical coherence tomography (OCT) focusing system; the method comprising a step of separately directing an overlapped measurement and reference wavefront towards a focus sensor and towards an imaging sensor;
  wherein a predefined focusing illumination spectrum of the overlapped wavefront is directed towards the focus sensor, and
  wherein a predefined measurement illumination spectrum of the overlapped wavefront is directed towards the imaging sensor.

In some embodiments, the method further comprising reflecting only the predefined focusing illumination spectrum from a reference surface of the OCT focusing system.

Some embodiments of the present invention provide a method for maintaining focus of an interferometer device having an optical metrology tool and an optical coherence tomography (OCT) focusing system; the method comprising:
  monitoring an interference beam, of a reference beam and a measurement beam, via a focus detector of the OCT focusing system;
  translating a reference surface of the OCT focusing system, such that a maximal fringe contrast is observed at the monitored interference beam; and
  before a measurement, translating the reference surface back to its nominal position and focusing the optical metrology tool, by adjusting the separation between a measurement objective lens of the optical metrology tool and a sample, such that the monitored interference beam yields the observed maximal fringe contrast.

In some embodiments, the method further comprising scanning and measuring separation between the reference surface and a reference objective lens of the OCT focusing system.

In some embodiments, the separation adjustment between the sample and measurement objective lens is proportional to the translation of the reference surface back to its nominal position.

In some embodiments, the steps of monitoring, scanning, measuring, translating and focusing are continuous.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The present invention relates to the field of metrology, and more particularly, to optimizing focus and measuring for imaging-based overlay metrology; for example, target structures at the surface of an overlay wafer, which may serve as a substrate for microelectronic devices.

Embodiments of the present invention are directed to inspection systems that incorporate an OCT focus system in a configuration with a potential to improve focus performance by maintaining focus during sample's stage moves and/or by providing different illumination spectrums for focusing and measurement tasks.

Some embodiments of the present invention provide a focusing tool, which is configured to provide optimal illumination spectrums for each of the measurement and focusing tasks. As different wavelengths penetrate to different depths in wafer device structures, it is often desirable to control, from which depth in the device the focus signal is derived. Accordingly, the optimal spectrum for focusing may be different than the optimal spectrum for wafer's overlay measurement.

According to some embodiments the present invention provides an inspection apparatus, as schematically demonstrated in FIGS. 3 and 4A, having: an interferometer device 3000,4000 configured to direct a measurement wavefront to reflect from a measurement surface 3060 and subsequently overlap with a reference wavefront to form an interference pattern, the measurement and reference wavefronts being derived from a common source.

According to some embodiments, the interferometer device 3000 comprises: a first beam splitter 3040 positioned to direct the measurement and reference wavefronts along different directions and subsequently recombine and direct them to a second beam splitter 3100; the second beam splitter 3100 positioned to direct the recombined measurement and reference wavefront (also noted as interference wavefront or interference beam) towards an imaging sensor 3120 and towards a focus sensor 3110; and a reference surface (also noted as reference reflector) 3090 positioned and configured to reflect the reference wavefront back towards the first beam splitter 3040, as demonstrated, all arranged in a Linnik-type interferometer configuration.

According to some embodiments, the interferometer 3000 further comprises a measurement objective lens 3050, optically coupled between the first beam splitter 3040 and the sample 3060. The measurement objective 3050 configured to focus and concentrate the measurement illumination beam onto a target on the sample's surface and in order to image the target onto the imaging sensor 3120.

According to some embodiments, the interferometer 3000 further comprises a reference objective lens 3080, optically coupled between the first beam splitter 3040 and the reference surface 3090. The reference objective 3080 configured to focus and concentrate the reference illumination beam onto the reference surface 3090. According to some embodiments, the reference objective lens is identical to the measurement objective lens.

Figure 3:
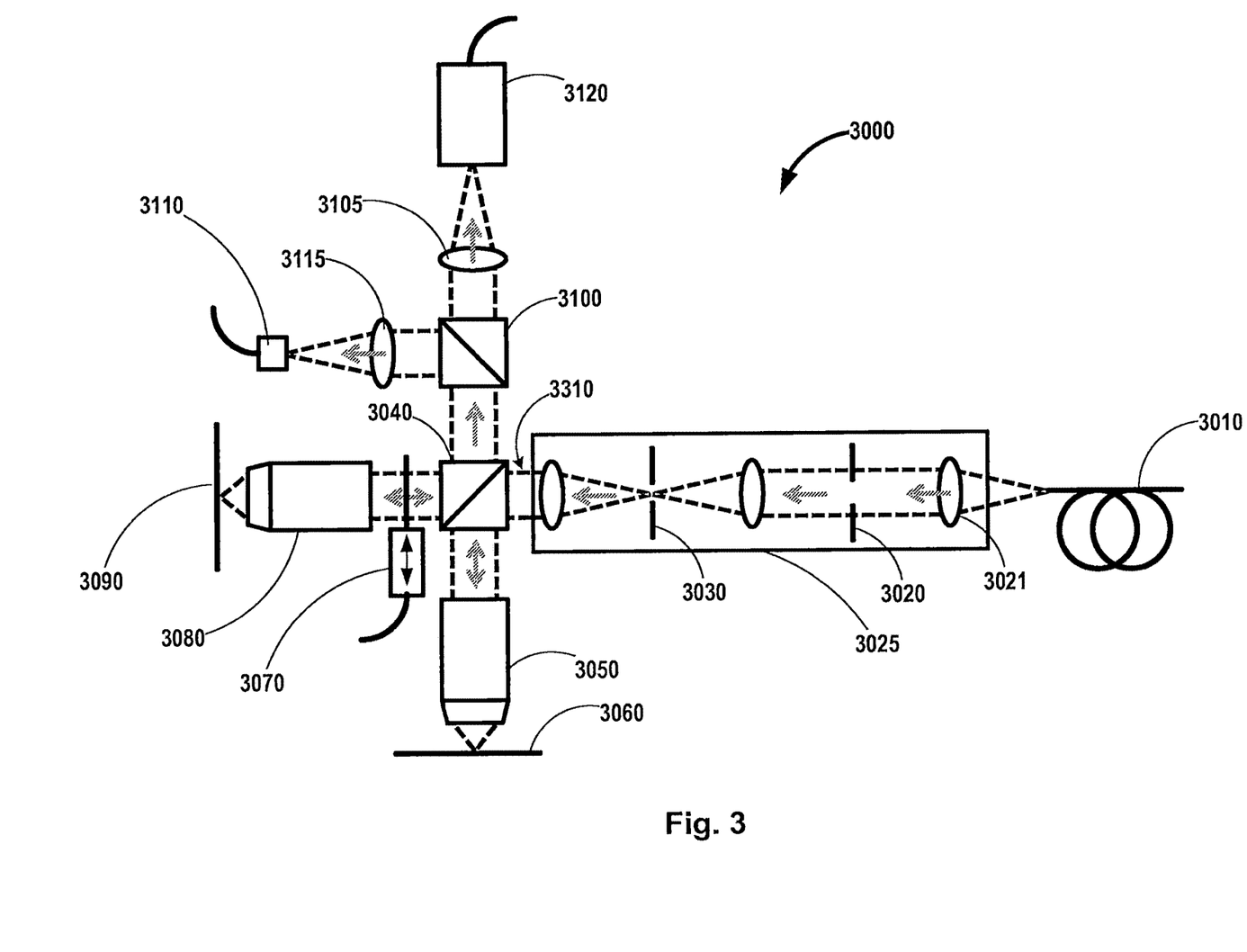
FIG. 3 schematically demonstrates an inspection apparatus, having an interferometer device, according to some embodiments of the invention.
Figures 4A, 4B:
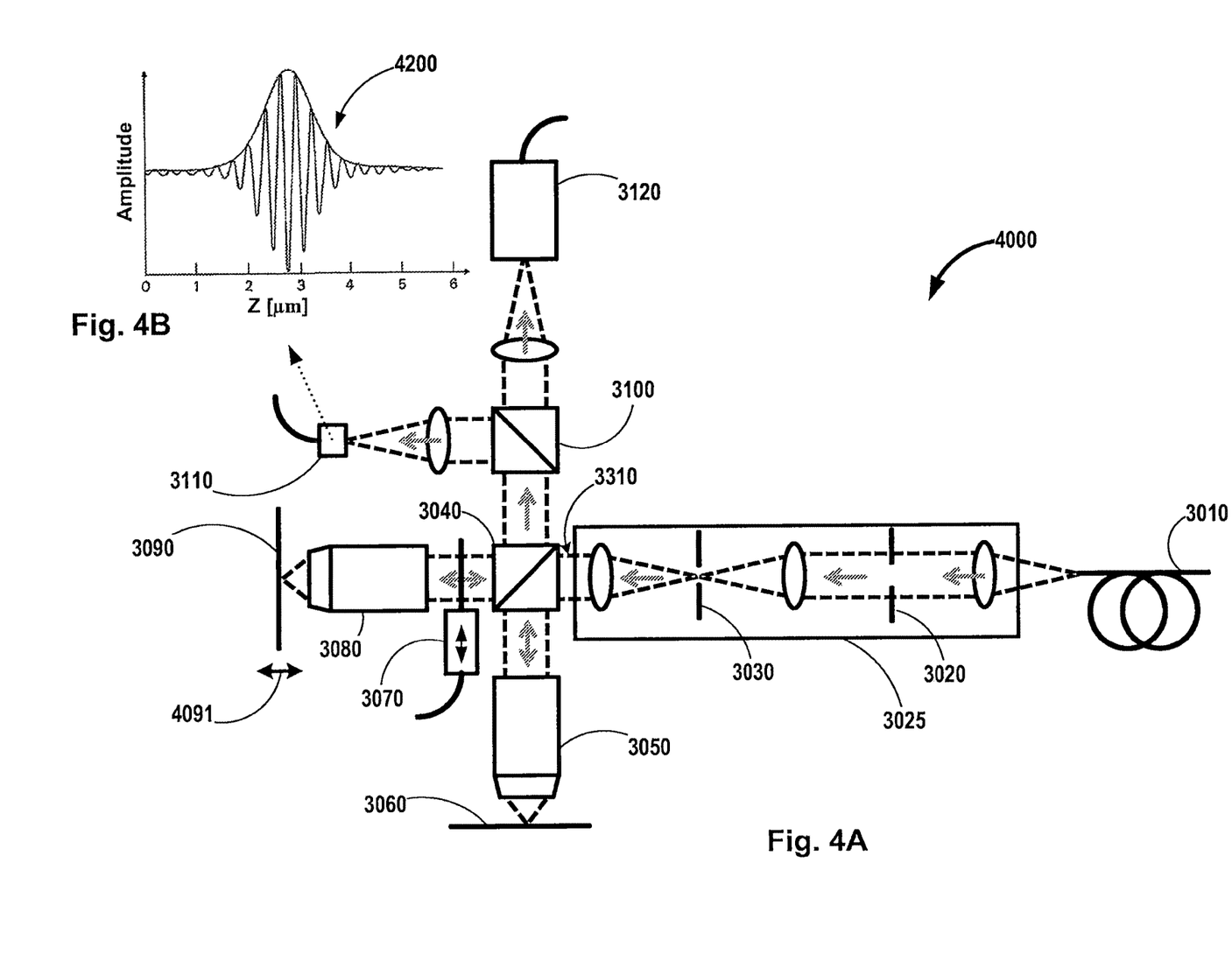
FIG. 4A schematically demonstrates another inspection apparatus, having an interferometer device, according to some embodiments of the invention.
FIG. 4B schematically demonstrates an output signal of the focus detector (FD), demonstrated in FIG. 4A, according to some embodiments of the invention.

The inspection apparatus as in FIG. 4A, demonstrates an interferometer device 4000 having some features similar to the device as demonstrated in FIG. 3. According to some embodiments of the invention, the interferometer device 4000 comprises:
  an optical metrology tool having an optical column with
    a first beam splitter 3040 optically coupled to a first objective 3050; and
  an optical coherence tomography focusing system comprising:
    a second objective 3080 and a reference surface 3090 arranged in an interferometer configuration with the first beam splitter (where the reference objective lens has complementary optical properties to the measurement objective lens, such that the optical path length of the measurement and reference arms match);
    a second beam splitter 3100 optically coupled to an output wavefront of the first beam splitter 3040.

According to some embodiments the first beam splitter 3040 is a 50/50 beam splitter (e.g. a Linnik beam splitter).

According to some embodiments, the second beam splitter 3100 is a dichroic beam splitter, which is configured to direct light/illumination within a predefined focusing spectrum to the focus sensor 3110 (optionally via a focus detector lens 3115), and direct light/illumination within a predefined measurement spectrum to the imaging sensor 3120 (optionally via relay lens/es 3105).

According to some embodiments, the reference surface 3090 is a dichroic reference reflector, which is configured to reflect light/illumination within a predefined focusing spectrum and to attenuate light/illumination within a predefined measurement spectrum.

According to some preferred embodiments, the second beam splitter 3100 is a dichroic beam splitter, configured to direct light/illumination within a predefined focusing spectrum; and the reference surface 3090 is a dichroic reference reflector, configured to reflect light/illumination within the predefined focusing spectrum and to attenuate light/illumination within a predefined measurement spectrum.

A non-limiting example for a preferred focusing spectrum is a wavelength within the range of 380-410 nm or 380-430 nm. A non-limiting example for a preferred measuring spectrum is a wavelength within the range of 430-1,200 nm.

According to some embodiments, the imaging sensor 3120 comprises a field plane array sensor. According to some embodiments, the imaging sensor 3120 comprises Charge-Coupled Device (CCD).

According to some embodiments, the interferometer 3000,4000 further comprises illumination optics 3025, optically coupled between an illumination source 3010 and the first beam splitter 3040. The illumination optics 3025 having angular and/or spatial dynamic control, configured for generating a probe beam of radiation 3310. According to some embodiments, the illumination source 3010 is a fiber optic coupler, which is configured to carry both the focusing and the measurement illumination spectrums.

According to some embodiments, the illumination optics 3025 comprise at least one of:
  an illumination pupil aperture 3020, configured to define the angular distribution of the illumination at the imaged object;
  an illumination field stop 3030, configured to limit the spatial extent of the illumination at the imaged object (thereby define the field of view); and
  at least one optical lens 3021.

According to some embodiments, the interferometer device 3000,4000 further comprises a mechanical shutter 1070 configured to selectively open and close an optical path between the first beam splitter 3040 and the reference objective lens 3080.

According to some embodiments, the interferometer device 3000,4000 further comprises a translating stage (not shown) configured to translate sample 3060 relative to the optical measurement beam.

The interferometer configuration, as demonstrated in FIGS. 3 and 4A, allows the providing of different illumination spectrum for the focusing and the measurement tasks. Accordingly, the focus signal 4200, demonstrated in FIG. 4B, can be detected simultaneously to the capturing of the measurement images, as the provided configuration allows only light within the focusing spectrum to return from the dichroic reference mirror 3090, while the dichroic beam splitter 3100 blocks light within the focusing spectrum from reaching the imaging sensor 3120, and blocks light within the measurement spectrum from reaching the focus sensor 3110.

Furthermore, according to some embodiments, the interferometer 3000,4000 configuration (as demonstrated in FIGS. 3 and 4A) enables optimizing illumination spectrum, used for deriving focus, to minimize influence of the wafer's processing variations; enables optimizing illumination spectrum, used for acquiring overlay target images, to maximize the desired system performance metrics (e.g. accuracy, overlay residuals, tool-induced-shift, and more), and enables a simultaneous optimization for both the acquiring (measuring) and the focusing tasks.

Some embodiments of the present invention provide a focusing tool, which is configured to maintain focus during the moves of the sample's stage, particularly when changing targets. Deviations of wafer and stage travel flatnesses induce unacceptable levels of image defocus. Accordingly, separation between the measurement objective and the wafer must be adjusted after moving to each overlay target and before acquiring the measurement image. Some embodiments of the present invention allow continuous focus maintenance during a stage move, and therefore the time required for re-acquiring focus after the move can be eliminated or at least reduced.

According to some embodiments, the interferometer device 3000,4000 further comprises a translation mechanism (not shown) mechanically coupled to the reference surface 3090, where the translation mechanism is configured to move the reference surface 3090 in a direction 4091 parallel to the optical axis of the reference objective 3080, for facilitating interferometer balancing. FIG. 4B demonstrates a focus sensor's 3110 optional output signal 4200, which can be analyzed in order to detect whether the probe beam 3310 is in focus at the sample 3060.

According to some embodiments, the interferometer device 3000,4000 further comprises a mechanical shutter 3070, configured to selectively open and close the optical path between the first beam splitter 3040 and the second objective 3080.

According to some embodiments, light returning from the reference arm (e.g. light returning from the reference surface 3090) is blocked during measurement (e.g. during the actual image capturing), from reaching to the first beam splitter 3040 (e.g. by a shutter 3070), to prevent the overlapping spectral region from reaching the imaging sensor 3120.

A common practice for an OCT system is generally noted with three steps: move, focus, and measure; where at the "move" step, the sample's stage (not shown) is moved to bring a target structure at the sample's surface into the imaging sensor's field of view, and after steps of "focus" and "measure" the stage is moved to set the measurement illumination onto the next target structure on the sample's surface which is to be imaged.

In order to maintain focus during stage move to each target at the sample's surface, some embodiments of the present invention provide a method for continuous focus monitoring and adjusting of an interferometer device having an optical metrology tool and an optical coherence tomography (OCT) focusing system (for example, a Linnik interferometer); the method comprising the following steps:
  scanning and measuring a separation between a reference surface (for example 3090) and a reference objective lens (for example 3080);
  monitoring an interference beam, of a reference beam and a measurement beam, via a focus sensor (for example 3110);
  shifting the reference surface position, where such that a maximal fringe contrast is observed at the monitored interference beam; and
  before a measurement, translating the reference surface back to its nominal position and focusing the optical metrology tool, by adjusting the separation between a measurement objective lens (for example 3050) of the optical metrology tool and a sample (for example 3060), such that the monitored interference beam yields the observed maximal fringe contrast.

According to some embodiments, the separation adjustment between the sample and measurement objective lens is according and proportional to the translation of the reference surface back to its nominal position. According to some non-limiting embodiments, the term "proportional" refers to a coefficient of 1.3 or less.

According to some embodiments, the term "nominal", refers to an accepted condition, which is a goal or an approximation. According to some embodiment, the nominal position of reference surface is about ±10 nm or less of its initial position.

According to some embodiments, the shifting is provided by a translation mechanism, which is configured to move the stage in a direction parallel to the optical axis of the reference objective lens.

According to some embodiments, the method for the focus monitoring and adjusting can be a continuous method, by means that the steps of the scanning, monitoring, and adjusting are continuous steps.

According to some embodiments, the method for the focus monitoring of the interferometer device enables a continuous monitoring of the separation between wafer and objective lens, and as a result changes in wafer height can be corrected during and/or after stage moves. Consequently, the time required to measure the overlay metrology can be considerably reduced. More details in FIG. 10.

Figure 5:
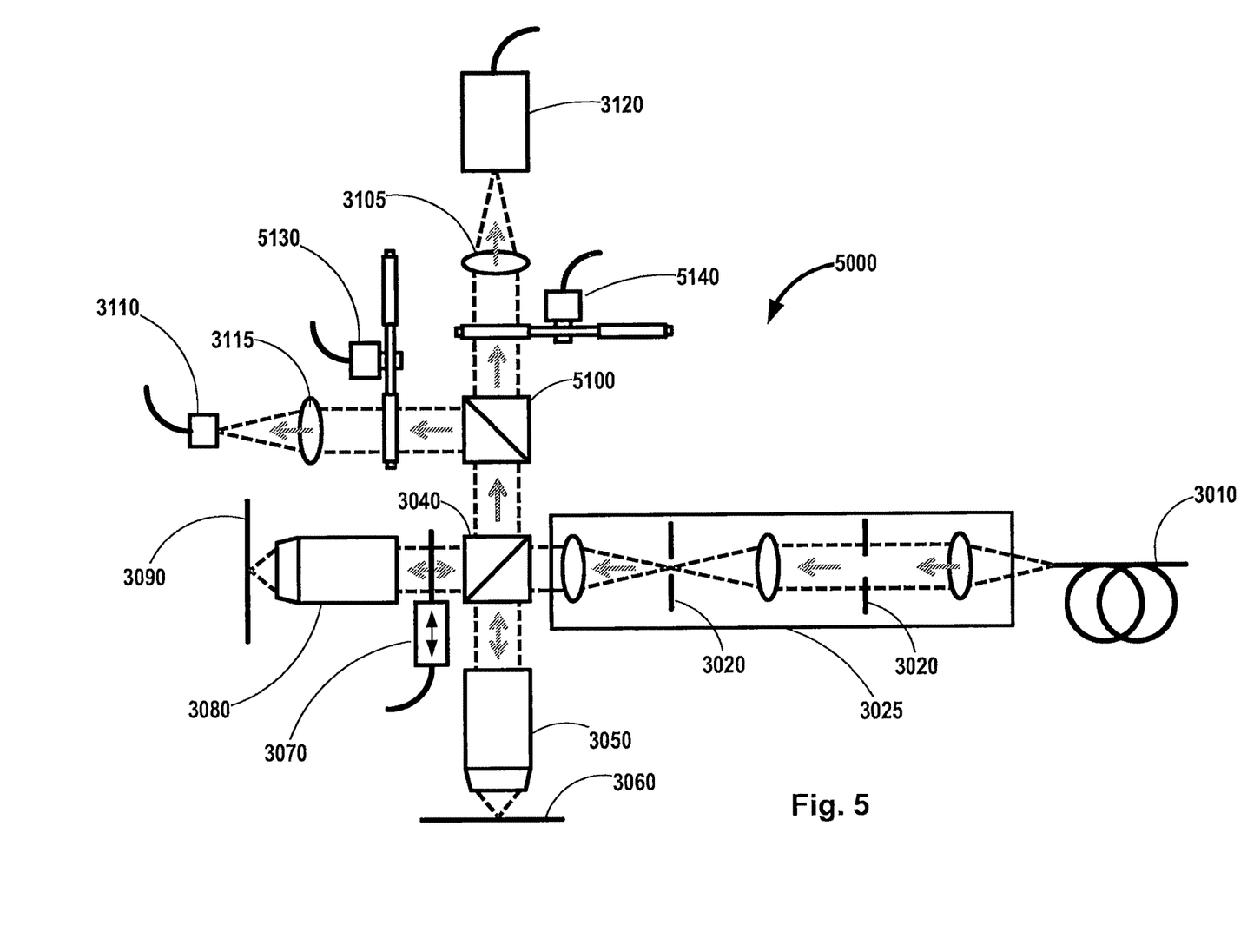
FIG. 5 schematically demonstrates another inspection apparatus, having an interferometer device, according to some embodiments of the invention.

Reference is now made to FIG. 5, which schematically demonstrates an interferometer device 5000, according to some embodiments of the invention, where some of its features are similar to the features of devices 3000,4000, as demonstrated in FIGS. 3 and 4A. According to some embodiments, the present invention provides an inspection apparatus comprising: an interferometer device 5000 configured to direct a measurement wavefront to reflect from a measurement surface 3060 and subsequently overlap with a reference wavefront to form an interference pattern, the measurement and reference wavefronts being derived from a common source. The interferometer 5000 comprises:
  an optical metrology tool having an optical column with a first beam splitter 3040 optically coupled to a first objective 3050; and
  an optical coherence tomography focusing system comprising:
    a second objective 3080 and a reference surface 3090 arranged in an interferometer configuration with the first beam splitter, and
    a second beam splitter 3100 optically coupled to an output wavefront of the first beam splitter 3040.

According to some embodiments, the reference surface 5090 is a dichroic reference mirror, which is configured to reflect light within a focusing spectrum and attenuate light within a measurement spectrum.

According to some embodiments, the second beam splitter 5100 is a 50/50 beam splitter.

According to some embodiments, the interferometer device 5000 further comprises a focus spectral filter wheel 5130, optically coupled between second beam splitter 5100 and the focus detector lens 3115, and which is configured to direct light within a focusing spectrum to the focus sensor 3110.

According to some embodiments, the interferometer device 5000 further comprises an imaging spectral filter wheel 5140, optically coupled between the second beam splitter 5100 and the tube lens/es 3105, and which is configured to direct light within the measurement spectrum to the imaging sensor 3120.

The interferometer configuration as demonstrated in FIG. 5 allows the providing of different illumination spectrum for the focusing and the measurement tasks. Accordingly, the focus signal, can be detected simultaneously to the capturing of the measurement images, as the provided configuration allows only light within the focusing spectrum to return from the dichroic reference mirror 3090, while the imaging spectral filter wheel 5130 blocks light within the focusing spectrum from reaching the imaging sensor 3120, and while the focus spectral filter wheel 5130 blocks light within the measurement spectrum from reaching the focus sensor 3110.

The interferometer configuration, as demonstrated in FIG. 5, enables focus and measurement illumination spectra to overlap. According to some embodiments, both the focus and the measurement spectra propagate on the measurement and reference arms. According to some embodiments, both the focus and the measurement spectra are directed toward both the focus and field plane sensors. According to some embodiments, a band pass filter (such as the focus filter wheel 5140) is inserted into the focus sensor arm to isolate the spectrum used for focus sensing. According to some embodiments, a different band pass filter (such as the focus imaging filter wheel 5130) is inserted into the field plane array sensor arm to isolate the spectrum used for overlay measurement. According to some embodiments, focus and measurement filters can be replaced by filters that modify the spectrum that reaches the sensor on each arm.

Figure 6:
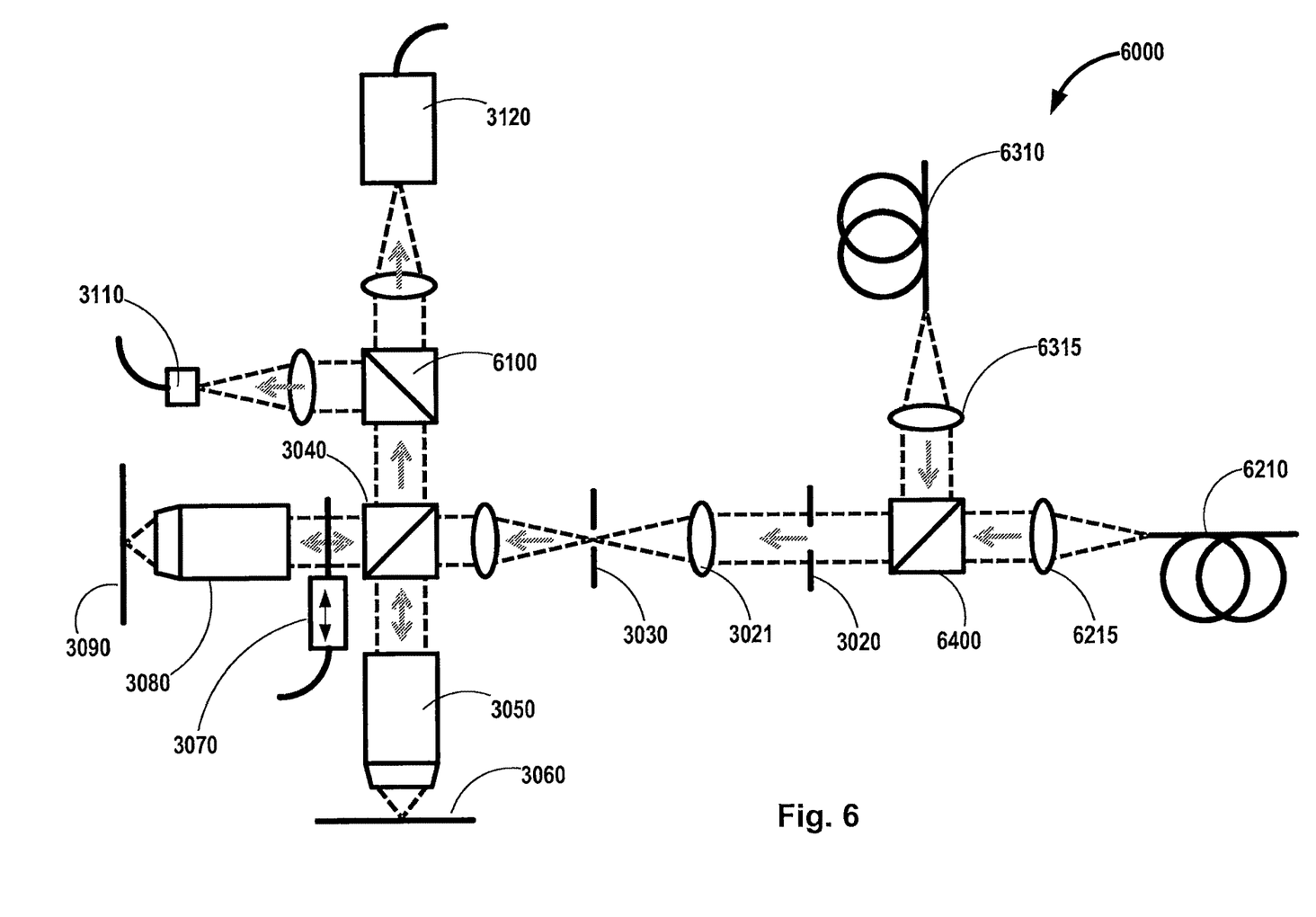
FIG. 6 schematically demonstrates another inspection apparatus, having an interferometer device, according to some embodiments of the invention.

Reference is now made to FIG. 6, which schematically demonstrates an interferometer device 6000, according to some embodiments of the invention, where some of its features are similar to the features of devices 3000, 4000 and 5000, as demonstrated in FIGS. 3, 4A and 5. According to some embodiments, the present invention provides an inspection apparatus comprising: an interferometer device 6000 configured to direct a measurement wavefront to reflect from a measurement surface 3060 and subsequently overlap with a reference wavefront to form an interference pattern, the measurement and reference wavefronts being derived from a common source. The interferometer 6000 comprises:

an optical metrology tool having an optical column with
   a first beam splitter 3040 optically coupled to a first objective 3050; and
an optical coherence tomography focusing system comprising:
   a second objective 3080 and a reference surface 3090 arranged in an interferometer configuration with the first beam splitter, and
   a second beam splitter 3100 optically coupled to an output wavefront of the first beam splitter 3040.

According to some embodiments, the reference surface 3090 is a dichroic reference reflector, which is configured to reflect light within a predefined focusing spectrum and attenuate light within a predefined measurement spectrum.

According to some embodiments, the second beam splitter 6100 is a dichroic beam splitter, as detailed in the above description of FIGS. 3 and 4A. According to other embodiments, the second beam splitter 6100 is a 50/50 beam splitter and where the interferometer device 6000 further comprises a focus spectral filter wheel 5130 and an imaging spectral filter wheel 5140, as shown and detailed in the description of FIG. 5 above (wheels 5130,5140 are not demonstrated in FIG. 6).

Accordingly, the interferometer configuration as demonstrated in FIG. 6 allows the providing of different illumination spectrum for the focusing and the measurement tasks.

According to some embodiments, the configuration of the device 6000 allows the use two of separate light sources 6210 and 6310 for supplying different illumination spectrums for the measurement and for the focus monitoring, and a dichroic beam splitter/combiner 6400, which is configured to efficiently combine the light from the two light sources 6210 and 6310, so that they can illuminate the same field of view.

According to some embodiments, the image-based overlay metrology system with focus sensing by Linnik interferometer as demonstrated in FIGS. 3, 4A, 4B, 5 and 6 enables:

independent definition for illumination spectra, for each of focus and measurement;
simultaneous focus acquisition and measurement by the isolating of the light returning from the wafer and reference mirror, based on their spectral content;
monitoring the separation between the wafer and measurement objective lens, by modulating or adapting the separation between reference mirror and Linnik objective lens (reference surface vs. reference objective lens);
accordingly, separation between the wafer and measurement objective lens can be monitored continuously.

According to some embodiments, applications and/or implementations of the present invention are configured for inspecting grating beside grating targets on a wafer, with each grating being printed on a different process layer. In some embodiments, applications of the present invention are configured for inspecting one pair of gratings oriented in the X axis for measuring X-overlay, and/or one pair in Y axis for measuring Y-overlay.

In some embodiments, target illumination can have broad or narrow spectral content. In some embodiments, wafer height can be adjusted to maximize contrast of image of target formed onto the imaging sensor. In some embodiments, Linnik interferometer can be used to regain wafer focus, after each stage move to a subsequent overlay target. In some embodiments, overlay measurements are extracted from relative locations of targets within captured images.

Figure 7:
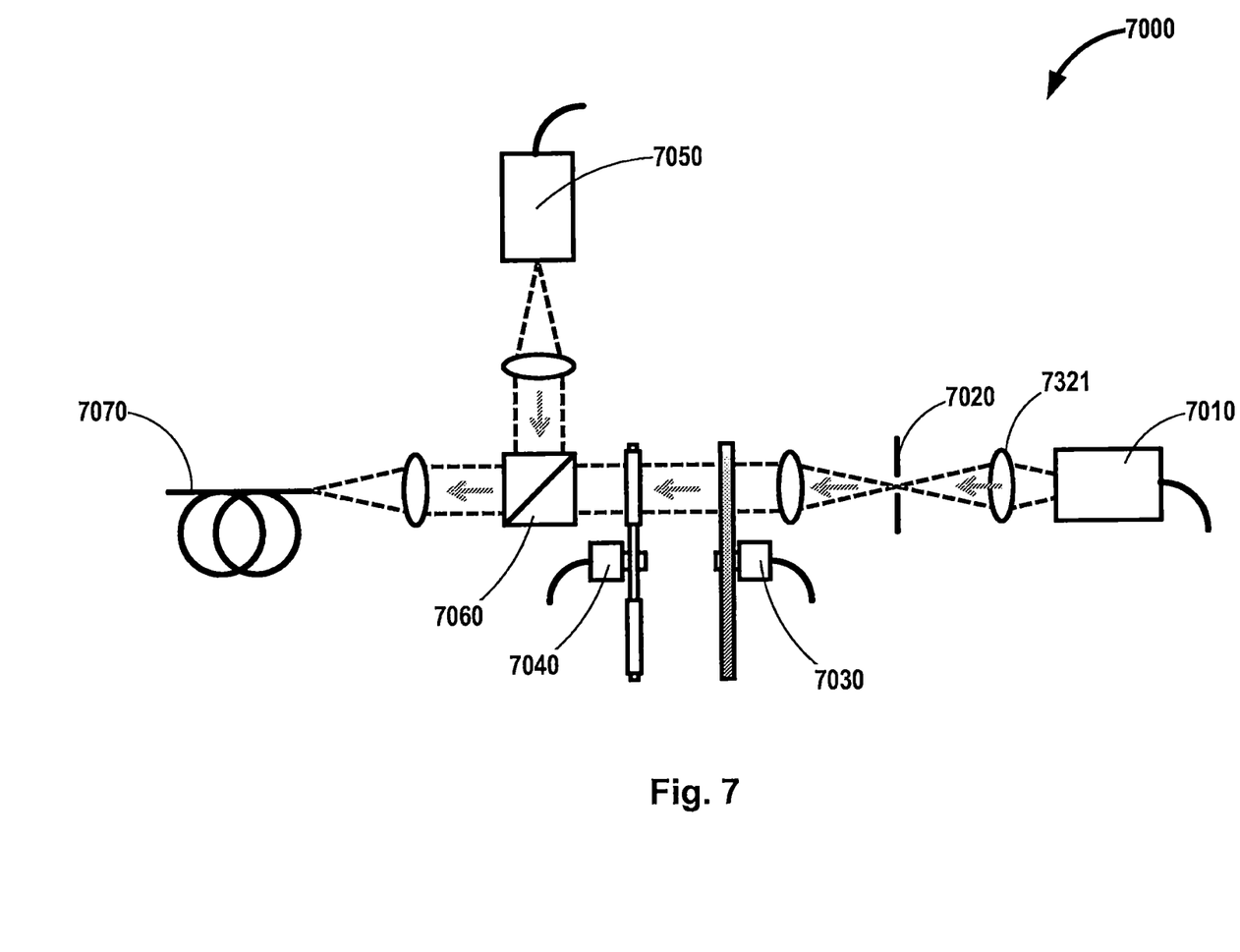
FIG. 7 schematically illustrates an exemplary implementation for the inspection apparatus, according to some embodiments of the invention.

Reference is now made to FIG. 7, which schematically illustrates an exemplary implementation for the inspection apparatus, according to some embodiments detailed above, a broadband illuminator 7000 with UV led for focus detection. As shown in FIG. 7 example, a laser driven plasma light source 7010 generates broadband radiation spanning visible and near-IR spectra. The laser driven plasma light source 7010 is optically coupled to a natural density wheel 7020, via at least one optical lens 7321 and an illumination field stop 7020. The neutral density wheel 7020 is configured to enable attenuation of light to avoid sensor saturation. The neutral density wheel 7020 is further coupled to a band pass filter wheel 7040, which is configured to enable selection of different spectral distributions from within the source's broad distribution. A dichroic beam splitter 7060 efficiently combines plasma spectra received via the band pass filter wheel 7040 with illumination received from a UV LED 7050, which is configured to provide fixed spectrum for focus sensing. The combined beam is then coupled into a multi-mode fiber 7070, thereby a broadband illuminating output.

Figures 8A, 8B:
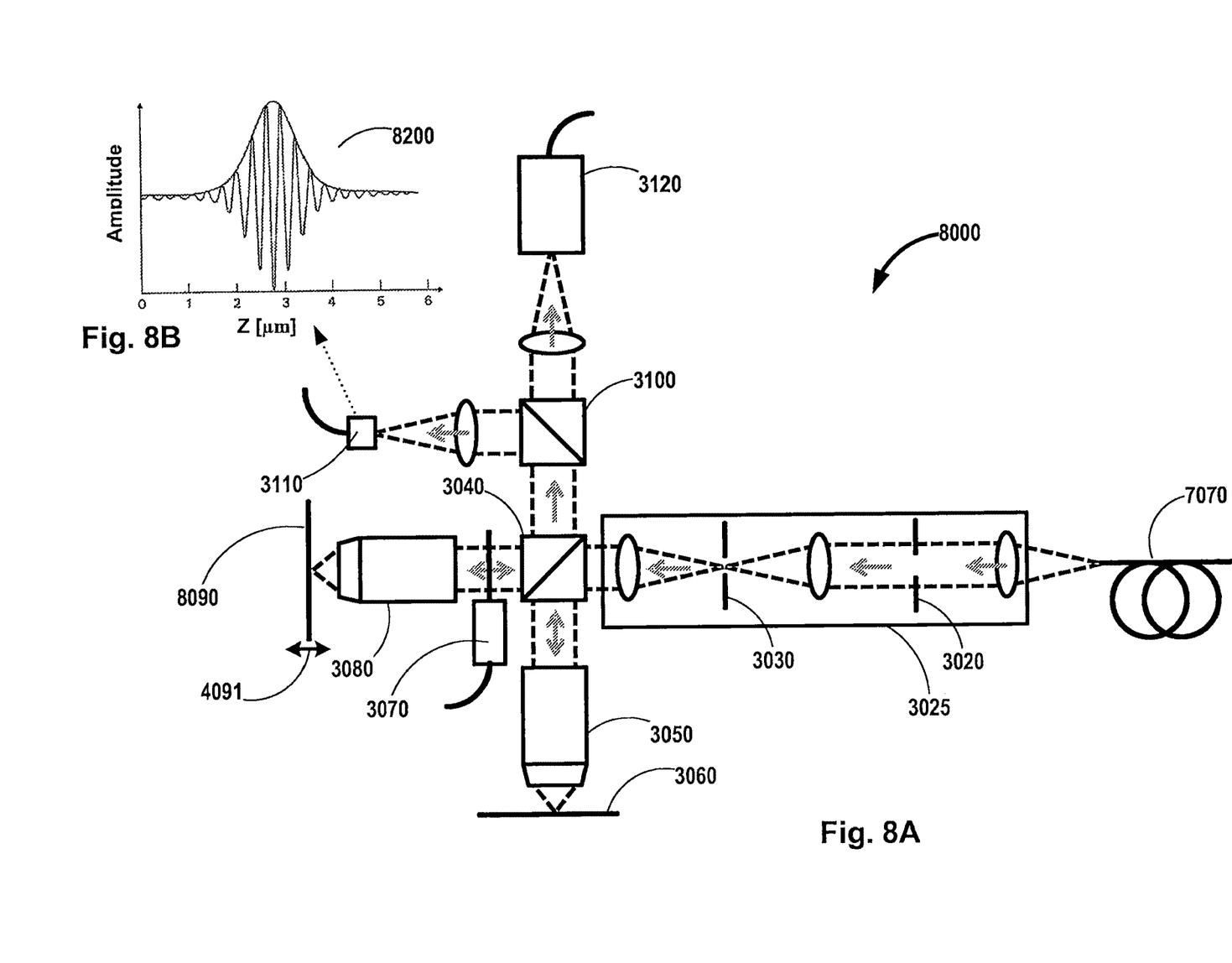
FIG. 8A schematically illustrates another exemplary implementation for the inspection apparatus, according to some embodiments of the invention.
FIG. 8B schematically demonstrates an output signal of the focus detector (FD), demonstrated in FIG. 8A, according to some embodiments of the invention.

Reference is now made to FIG. 8A, which schematically illustrates an exemplary implementation for the inspection apparatus, according to some embodiments detailed above, an overlay metrology microscope head 8000. Output from a multi-mode fiber 7070 (also shown in FIG. 7) is split into measurement and reference paths by a Linnik beam splitter 3040. Reference mirror 8090 comprises a dichroic coating, such that it reflects the UV spectrum from the LED 7050 (shown in FIG. 7) and attenuates the broad band spectrum from a laser driven plasma source 7010 (shown in FIG. 7). Wafer 3060 reflects both the UV spectrum from the LED and the broad band spectrum from the laser driven plasma source. In particular, the UV spectrum reflects from the top layers of the wafer, so that impacts on focus sensing from wafer processing variations and features on previous layers are minimized. Visible and near-IR spectrums are able to penetrate to lower layers in the wafer as necessary for viewing overlay targets printed on those layers. Dichroic beam splitter 3100 efficiently routes UV light from the reference and measurement paths to the focus sensor. Dichroic beam splitter also efficiently routes visible and near-IR measurement light to the field array sensor. According to some embodiments, reference mirror 8090 can be modulated to provide continuous sensing and correction of wafer height position. FIG. 8B schematically demonstrates an optional output signal 8200 of the focus detector (FD) 3110, as demonstrated in FIG. 8A, according to some embodiments of the invention.

Figure 9:
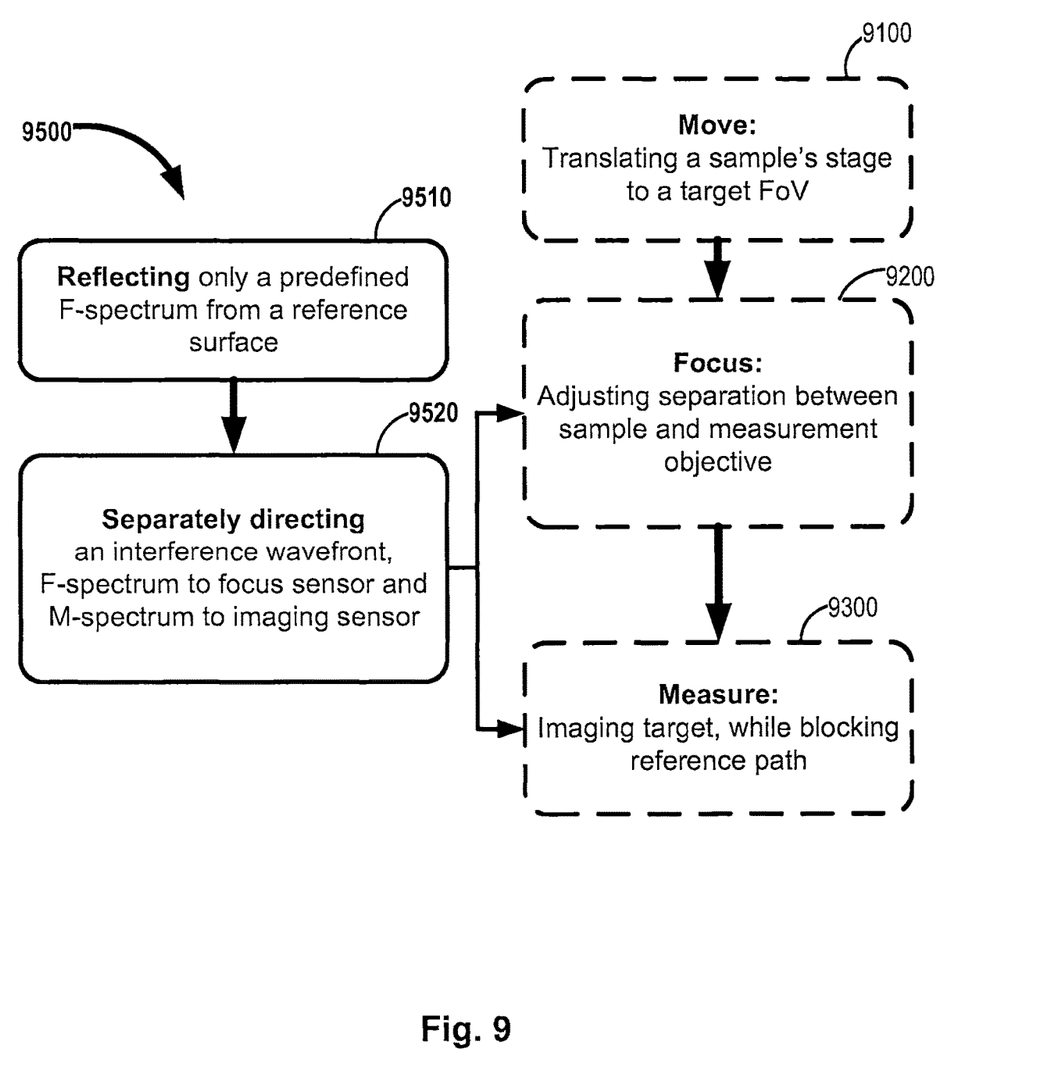
FIG. 9 schematically demonstrates a method for optimal focusing and measuring, according to some embodiments of the invention.

Reference is now made to FIG. 9, which schematically demonstrates the process of focusing and measuring a target on a sample (e.g. wafer), according to some embodiments of the invention, using an interferometer device having an OCT focus system. The process includes:

translating 9100 the sample, to set the field of view (FoV) onto a current target on the sample's surface;

focusing 9200 the illumination onto the target, by adjusting separation between the sample and the measurement objective lens; and measuring (i.e. imaging) 9300 the current target, while blocking the reference beam path, from returning to the first (Linnik) beam splitter.

According to some embodiments, the focusing 9200 is achieved by: directing the measurement wavefront to reflect from the target, and subsequently overlap with a reference wavefront, to form the interference beam; and by directing the interference beam towards the focus sensor and towards the imaging sensor; and where the adjusting of the separation between the measurement objective lens and the sample is such that a maximal fringe contrast is observed at the scanned interference beam (via a focus sensor).

According to some embodiments, the present invention provides a method for optimal focusing and measuring using an interferometer device having an optical coherence tomography (OCT) focusing system; the method 9500 comprising a step of separately directing 9520 an overlapped measurement and reference wavefront towards a focus sensor and towards an imaging sensor; wherein a predefined focusing illumination spectrum of the overlapped wavefront is directed towards the focus sensor, and wherein a predefined measurement illumination spectrum of the overlapped wavefront is directed towards the imaging sensor.

According to some embodiments, the method 9500 further comprises reflecting 9510 only the predefined focusing illumination spectrum from a reference surface of the OCT focusing system, that is, prior to the overlapping of the measurement and reference wavefront.

FIG. 9 further demonstrates the integration of the method 9500 for optimal focusing and measuring with the process of focusing 9200 and measuring 9300, according to some embodiments of the invention.

Figure 10:
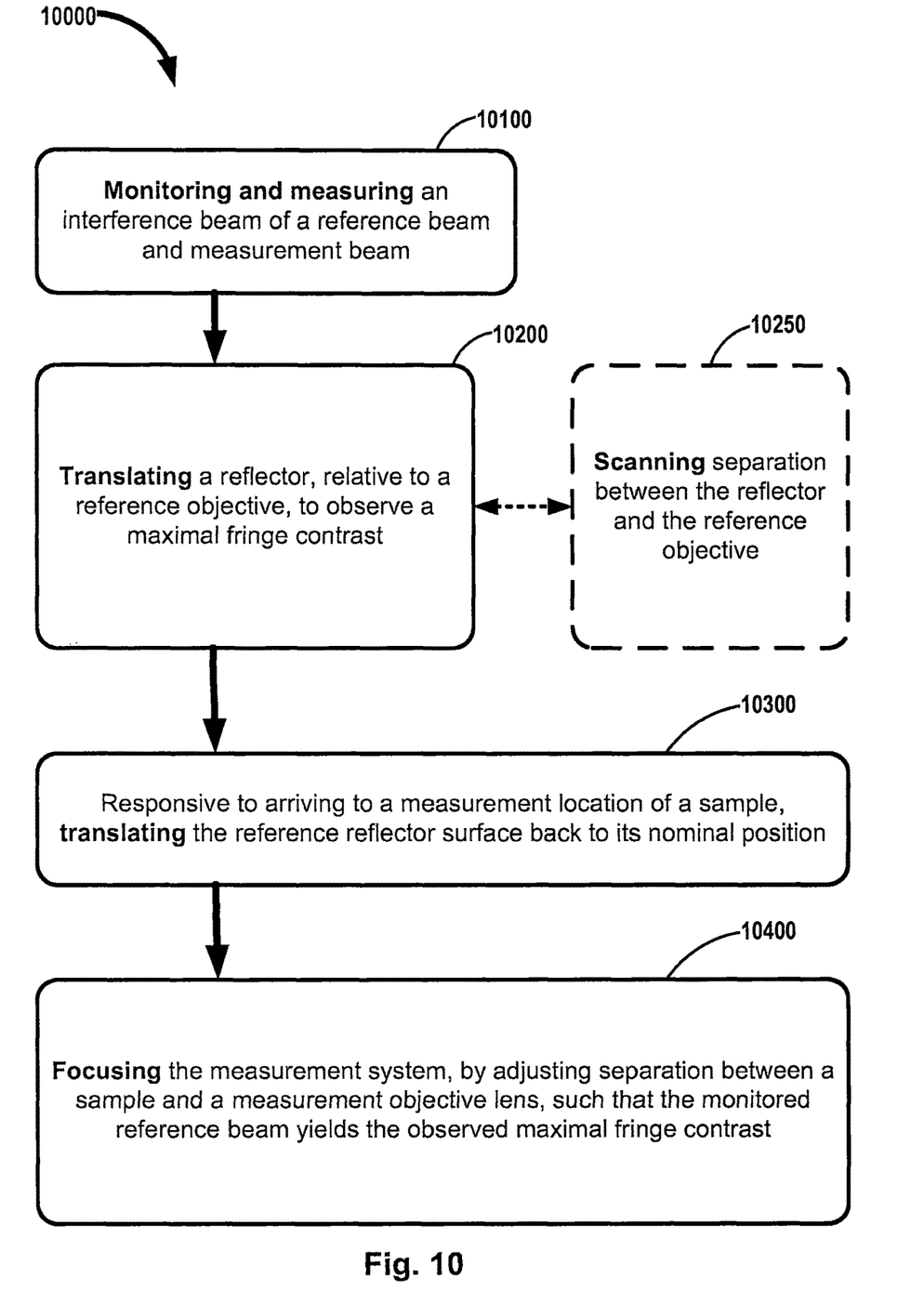
FIG. 10 schematically demonstrates a method for maintaining focus, according to some embodiments of the invention.

Reference is now made to FIG. 10, which schematically demonstrates a method 10000 for maintaining focus of an interferometer device having an optical metrology tool and an optical coherence tomography (OCT) focusing system; for example during sample's stage move to each target at the sample's surface.

According to some embodiments of the present invention; the method 10000 comprising:

monitoring and measuring 10100 an interference beam of a reference beam and a measurement beam, via a focus sensor (of the OCT system);

translating 10200 a reference reflector surface (of the OCT system), relative to a reference objective lens, to observe a maximal fringe contrast, at the monitored interference beam;

responsive to arriving to a measurement location of a sample, translating 10300 the reference reflector surface back to its nominal position in a known amount; and focusing the optical metrology tool, by adjusting 10400 separation between a sample and a measurement objective lens (of the optical metrology tool), in a vertical step, proportional to the known amount, such that the monitored reference beam yields the observed maximal fringe contrast.

According to some embodiments, the method 10000 further comprises scanning and measuring separation 10250 between the reference reflector and the reference objective lens.

According to some embodiments, the steps of monitoring, measuring, scanning, translating and focusing are continuous.

According to some embodiments, the method as described above and in FIG. 10 can be applied on an interferometer device 3000, 4000, 5000, 6000, 7000, 8000 as in the above embodiments.

According to at least some of the provided embodiments, scatterometry-based overlay systems can have the ability to optimize focus at wavelengths different than the measurement wavelength. Imaging-based overlay systems can provide similar levels of robustness to process variations through the implementation of this invention.

Furthermore, the process of re-acquiring focus of the overlay target after each move, constitutes a significant amount of the "move and measure" time budget. Continuous focus tracking can significantly reduce the cost-of-ownership for image-based overlay measurement.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A metrology and inspection system, comprising:
   an optical metrology tool configured to perform optical metrology within a predetermined measurement spectrum, having an optical column with a first beam splitter optically coupled to a first objective; and
   an optical coherence tomography focusing system comprising:
      a second objective and a reference surface arranged in an interferometer configuration with the first beam splitter, and
      a second beam splitter optically coupled to an output wavefront of the first beam splitter;

wherein
the reference surface is a dichroic reflector, configured to reflect illumination within a predetermined focusing spectrum and attenuate light within the predetermined measurement spectrum.

2. The system according to claim 1, further comprising illumination optics optically coupled to the first beam splitter.

3. The system according to claim 2, further comprising an illumination input optically coupled to the illumination optics.

4. The system according to claim 3, wherein the illumination input comprises a fiber optic coupler, configured to carry both the focusing and the measurement illumination spectrums.

5. The system according to claim 2, wherein the illumination optics comprises: at least one optical lens, an illumination pupil aperture and an illumination field stop.

6. The system according to claim 1, further comprising a mechanical shutter, configured to selectively open and close the optical path between the first beam splitter and the second objective.

7. The system according to claim 1, further comprising at least one of: focus detector lens and at least one tube lens.

8. The system according to claim 1, wherein the predetermined focusing spectrum is about 380-430 nm and the predetermined measuring spectrum is about 430-1200 nm.

9. A metrology and inspection system, comprising:
an optical metrology tool configured to perform optical metrology within a predetermined measurement spectrum, having an optical column with a first beam splitter optically coupled to a first objective; and
an optical coherence tomography focusing system comprising:
a second objective and a reference surface arranged in an interferometer configuration with the first beam splitter, and
a second beam splitter optically coupled to an output wavefront of the first beam splitter;
wherein the second beam splitter is a dichroic beam splitter configured to direct illumination within a predetermined focusing spectrum to a focus sensor and to direct illumination within the predetermined measurement spectrum to an imaging sensor; and
wherein the reference surface is a dichroic reflector, configured to reflect illumination within the predetermined focusing spectrum and attenuate light within the predetermined measurement spectrum.

10. The system according to claim 9, further comprising illumination optics optically coupled to the first beam splitter.

11. The system according to claim 10, further comprising an illumination input optically coupled to the illumination optics.

12. The system according to claim 11, wherein the illumination input comprises a fiber optic coupler, configured to carry both the focusing and the measurement illumination spectrums.

13. The system according to claim 10, wherein the illumination optics comprises: at least one optical lens, an illumination pupil aperture and an illumination field stop.

14. The system according to claim 9, further comprising a mechanical shutter, configured to selectively open and close the optical path between the first beam splitter and the second objective.

15. The system according to claim 9, further comprising at least one of: focus detector lens and at least one tube lens.

16. The system according to claim 9, wherein the predetermined focusing spectrum is about 380-430 nm and the predetermined measuring spectrum is about 430-1200 nm.

* * * * *